(12) United States Patent
Thalhammer et al.

(10) Patent No.: US 8,258,894 B2
(45) Date of Patent: Sep. 4, 2012

(54) COUPLED RESONATOR FILTER WITH A FILTER SECTION

(75) Inventors: Robert Thalhammer, Munich (DE); Martin Handtmann, Munich (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 547 days.

(21) Appl. No.: 11/756,571

(22) Filed: May 31, 2007

(65) Prior Publication Data

US 2008/0297279 A1 Dec. 4, 2008

(51) Int. Cl.
*H03H 9/58* (2006.01)
*H01L 41/22* (2006.01)

(52) U.S. Cl. .................... 333/189; 333/187; 333/133

(58) Field of Classification Search .......... 333/133, 333/189, 186, 187, 27 R
See application file for complete search history.

(56) References Cited

U.S. PATENT DOCUMENTS

| | | | | |
|---|---|---|---|---|
| 5,892,418 A | * | 4/1999 | Onishi et al. | 333/193 |
| 5,910,756 A | * | 6/1999 | Ella | 333/133 |
| 6,204,737 B1 | * | 3/2001 | Ella | 333/187 |
| RE37,639 E | * | 4/2002 | Ehara et al. | 333/193 |
| 6,597,261 B2 | * | 7/2003 | Tsutsumi et al. | 333/193 |
| 6,720,844 B1 | | 4/2004 | Lakin | |
| 7,212,083 B2 | * | 5/2007 | Inoue et al. | 333/189 |
| 7,212,085 B2 | * | 5/2007 | Wu | 333/189 |
| 7,230,509 B2 | * | 6/2007 | Stoemmer | 333/133 |
| 7,276,994 B2 | * | 10/2007 | Takeuchi et al. | 333/189 |
| 2004/0257172 A1 | * | 12/2004 | Schmidhammer et al. | 333/133 |
| 2005/0012570 A1 | | 1/2005 | Korden et al. | |
| 2005/0030126 A1 | | 2/2005 | Inoue et al. | |
| 2006/0055485 A1 | * | 3/2006 | Lobeek | 333/133 |
| 2006/0119453 A1 | | 6/2006 | Fattinger et al. | |

FOREIGN PATENT DOCUMENTS

JP 2002/217676 8/2002

OTHER PUBLICATIONS

Lakin, K.M., et al., "Wide Bandwidth Thin Film BAW Filters," IEEE Ultrasonics Symposium, vol. 1, Aug. 2004, 4 pages.
Lakin, K.M., et al., "Thin Film BAW for Wide Bandwidth and High Performance Applications," IEEE MTT-S International, Microwave Symposium Digest, vol. 2, Jun. 2004, pp. 923-926.

* cited by examiner

*Primary Examiner* — Shawki S Ismail
*Assistant Examiner* — Crystal L Hammond

(57) ABSTRACT

A bulk acoustic wave (BAW) filter device includes a first port, a second port, a first coupled resonator filter stage, a second coupled resonator filter stage and a filter section. The first coupled resonator filter stage includes a first BAW resonator connected to the first port and a second BAW resonator acoustically coupled to the first BAW resonator. The second coupled resonator filter stage includes a third BAW resonator connected to the second port and a fourth BAW resonator acoustically coupled to the third BAW resonator. The filter section includes a fifth BAW resonator, the fifth BAW resonator connected between the second BAW resonator and the fourth BAW resonator.

21 Claims, 7 Drawing Sheets

COUPLED RESONATOR FILTER WITH A FILTER SECTION

BACKGROUND

The present invention relates to the field of bulk acoustic wave devices and combinations with ladder and lattice type filter.

SUMMARY OF THE INVENTION

Embodiments of the present invention are related to a bulk acoustic wave (BAW) filter device comprising a first port, a second port, a first coupled resonator filter stage, a second coupled resonator filter stage and a filter section. The first coupled resonator filter stage comprises a first BAW resonator connected to the first port and a second BAW resonator acoustically coupled to the first BAW resonator. The second coupled resonator filter stage comprises a third BAW resonator connected to the second port and a fourth BAW resonator acoustically coupled to the third BAW resonator. The filter section comprises a fifth BAW resonator, the fifth BAW resonator connected between the second BAW resonator and the fourth BAW resonator.

BRIEF DESCRIPTION OF THE DRAWINGS

Features of embodiments of the invention will be more readily appreciated and better understood with reference to the following detailed description, which should be considered with reference to the accompanying drawings, in which.

Figure 1:
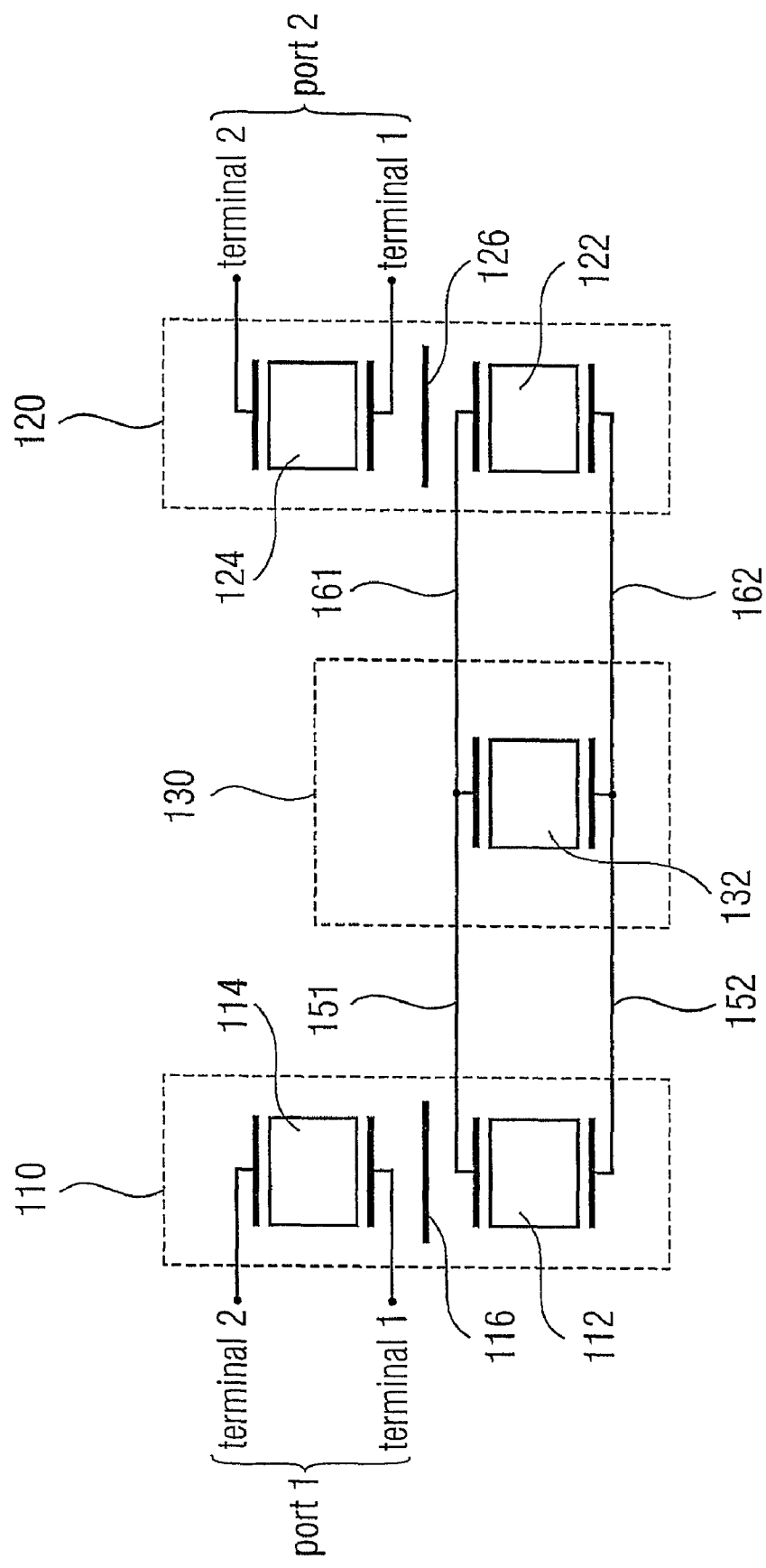
FIG. 1 shows a hybrid coupled resonator filter according to an embodiment of the present invention.

Before embodiments of the present invention are explained in more detail below with reference to the drawings, it is to be noted that equal elements of those operating in an equal manner are provided with the same or similar reference numerals in the figures, and that a repeated description of these elements is omitted.

DETAILED DESCRIPTION OF ILLUSTRATIVE EMBODIMENTS

Conventional filter technologies, which for example, are used in mobile applications for a frequency range of 1 to 10 Gigahertz use, for example, surface acoustic wave (SAW) resonators or ceramic filters. A promising candidate for replacing these old filters are BAW (Bulk Acoustic Wave) resonators. A typical BAW resonator comprises a piezoelectric layer sandwiched between two electrodes. An acoustic isolation from a substrate can be achieved by creating an air interface or by applying an acoustical mirror between the BAW resonator and the substrate. The first one being denoted as a membrane device and the latter one being the so-called solidly mounted resonator (SMR). The acoustical mirror is typically composed of a layer assembly of alternating high and low impedance materials providing good reflection of acoustic waves at an intended operation frequency. There are also various methods of producing a membrane device, either by surface or by bulk micro-machining.

RF filters based on acoustic resonators are of great interest for many RF applications and several concepts of manufacturing these filters are known. So-called ladder and lattice type filters are electric circuits comprising acoustic resonators as their components. One popular alternative are so-called coupled resonator filters (CRF) using two piezoelectric or BAW resonators stacked on top of each other that are partially coupled acoustically by an acoustical coupling layer formed between the two BAW resonators. The BAW resonator, which is arranged between the substrate and the coupling layer is also called lower resonator, whereas the other one is called upper resonator. In this convention, "lower" refers to the direction pointing to the substrate and "upper" to the direction pointing away.

These filters comprise an output and an input port and, as the output port of the filter is electrically isolated from the input port, coupled resonator filters offer three major advantages, namely a smaller chip size, a larger stop band attenuation compared to ladder type filters and an inherent ability for mode conversion, for example, converting a single ended input to a balanced output. A major drawback, however, is the—compared to ladder type filters—much less steep or flat filter roll-offs.

To overcome the problem of the flat CRF filter roll-offs, hybrid filters can be used. The hybrid filters comprise a traditional ladder (or lattice) type filter and a coupled resonator filter connected in series. For production cost reasons, a monolithic integration of both resonator types would be desirable. Conventional monolithic hybrid CRF use the upper piezoelectric layer of the two piezoelectric layers in the CRF stack for forming a series and/or shunt resonators of the ladder type filter. In this conventional case, the electrodes adjacent to the lower piezoelectric layer, which is formed between the coupling layer and the substrate, are omitted. This conventional process offers the advantage that no additional photolithographic steps are required. However, the coupling and the quality factor of the series and shunt resonators are poor.

On the other hand, coupled resonator filters are typically realized as a U-shaped configuration, wherein the lower resonators of the two CRF stacks are connected in parallel. This configuration enables a simple manufacturing process as no vias in the lower piezoelectric layer are required, but a major drawback is that the RF matching of the two stages (two CRF) is poor—as both impedances are capacitive.

Embodiments of the present invention provide a bulk acoustic wave filter device comprising a first and second port, a filter section, and first and second coupled resonator filter stages. The first coupled resonator filter stage comprises a first BAW resonator connected to the first port and a second BAW resonator acoustically coupled to the first BAW resonator. The second coupled resonator filter stage comprises a third BAW resonator connected to the second port and a fourth BAW resonator acoustically coupled to the third BAW resonator. The filter section comprises a fifth BAW resonator, the fifth BAW resonator connected between the second BAW resonator and the fourth BAW resonator.

Embodiments of the present invention use, therefore, a specific concept for combining, for example, a ladder or lattice type filter (or filter section) and coupled resonator filters by putting a ladder or lattice type filter between the lower resonators of the two CRF stages. As explained before, the lower resonator (the second or fourth BAW resonator) of a CRF refers to the resonator that is formed between the substrate and the coupling layer resonator of the CRF. The circuit according to embodiments connecting the CRF stages improves the roll-offs of the entire hybrid filter and introduces additional options to improve the matching of the two CRF stages.

Embodiments of the invention also include a way or method of monolithically integrating all components of the circuit. This method uses an etch step to remove the upper piezoelectric layer and the layer (comprising an oxide, for example) between the upper and lower piezo layer (or piezoelectric layer) to form a series or shunt resonator by using the lower piezoelectric layer and its adjacent electrodes. Therefore, the series and shunt resonators use just one piezo layer, namely the lower piezo layer, of the entire stack. The step of removing the upper piezo layer and the exemplary oxide between the two piezo layers is done, e.g., to enable a high quality factor and a high coupling of the series and shunt resonators. The oxide layer between the two piezo layers can be part of the coupling layers between the two BAW resonators comprising the CRFs.

In the simplest case, the two lower resonators of the CRF stacks are connected by a shunt resonator—a BAW resonator connected in parallel, e.g., to the lower resonators of the CRF stack. More sophisticated implementations use higher order ladder type filters (more stages) connecting the lower CRF resonators. If these circuits are realized, only one more photolithography in addition to the CRF process is needed, but vias in the lower piezo layer are not needed.

In a further embodiment, instead of ladder type filters lattice type filters are used for connecting the lower resonators of the two CRF stages. A major advantage for using lattice type filters in this circuitry can be, besides better filter roll-offs, an increased bandwidth of the filter. For these circuits, however, vias in the lower piezoelectric layer are definitely needed.

Possible materials for layers with high acoustic impedance comprise, for example, W, Mo, Pt, Ta, TiW, TiN, Ir, WSi, Au, $Al_2O_3$, SiN, $Ta_2O_5$ and Zirkon-oxide, wherein the last four are dielectrical materials. Possible materials for the piezoelectric layers are, for example, AlN, ZnO, PZT and $LiNbO_3$. A material for lower acoustic impedance is, for example, aluminum.

Embodiments of the present invention provide, therefore, a specific configuration of a hybrid CRF and the corresponding circuits enable to combine two advantages. First, a simple monolithic manufacturing process that does not need vias in the lower piezoelectric layer of the CRF stack. This production simplicity implies reduced costs of manufacturing when compared to conventional methods. Second, the ladder or lattice type filter between the CRF stages introduces additional design parameters, which are, for example, resonance frequencies and/or areas of the series and shunt resonators that can be used to improve the matching of the CRF stages. This in turn reduces the overall insertion and return loss and at the same time, the circuit is suitable for a monolithic integration and can be manufactured to achieve a large coupling and a high quality factor of the series and shunt resonators.

FIG. 1 shows a hybrid CRF according to embodiments of the present invention including a first CRF stage 110 and a second CRF stage 120, which are connected by a filter section 130. The first CRF stage 110 includes a second BAW resonator 112 and a first BAW resonator 114 which are acoustically coupled by a coupling layer 116. In addition, the first CRF stage 110 includes a first port (or port 1) with a first terminal or terminal 1 (e.g., for ground in) and a second terminal or terminal 2 (e.g., for signal in), which are connected to the first BAW resonator 114 of the first CRF stage 110. The first terminal can, for example, be connected to a (lower) electrode of the first BAW resonator 114 formed between the coupling layer 116 and the piezo layer of the of the first BAW resonator 114 (and the second terminal can be connected on the other electrode). The second CRF stage 120 includes a fourth BAW resonator 122 and a third BAW resonator 124 which are acoustically coupled by a coupling layer 126. The second CRF stage 120 furthermore includes a second port (or port 2) with a terminal 1 (e.g., for ground out) and a terminal 2 (e.g., for signal out). Terminal 1 of the second port can, for example, be connected to a (lower) electrode of the third BAW resonator 124 formed between the coupling layer 126 and the piezo layer of the third BAW resonator 124 of the second CRF stage 120.

The filter section 130 includes a third port with a first terminal 151 and a second terminal 152, a shunt BAW resonator 132 and fourth port with a first terminal 161 and a second terminal 162, wherein the shunt BAW resonator 132 is connected in parallel to the first and second terminals 151 and 152 of the third port and is connected in parallel to the first and second terminals 161 and 162 of the fourth port. The filter section 130 connects the first and second CRF stages 110 and 120, so that the shunt BAW resonator 132 and the second and fourth BAW resonators 112 and 122 of the first and second CRF stages 110 and 120 are connected in parallel.

In this embodiment, the second and fourth BAW resonators 122, 112 of the first and second CRF stages 110 and 120 and the shunt BAW resonator 132 can be formed at different sites (or places) of a piezo layer and can share a common piezoelectric layer. The parallel connection can then be obtained by connecting the electrodes of the second and fourth BAW resonators 122, 112 and the shunt BAW resonator 132 on either side of the common piezo layer (this will be explained in more detail below).

Figure 2:
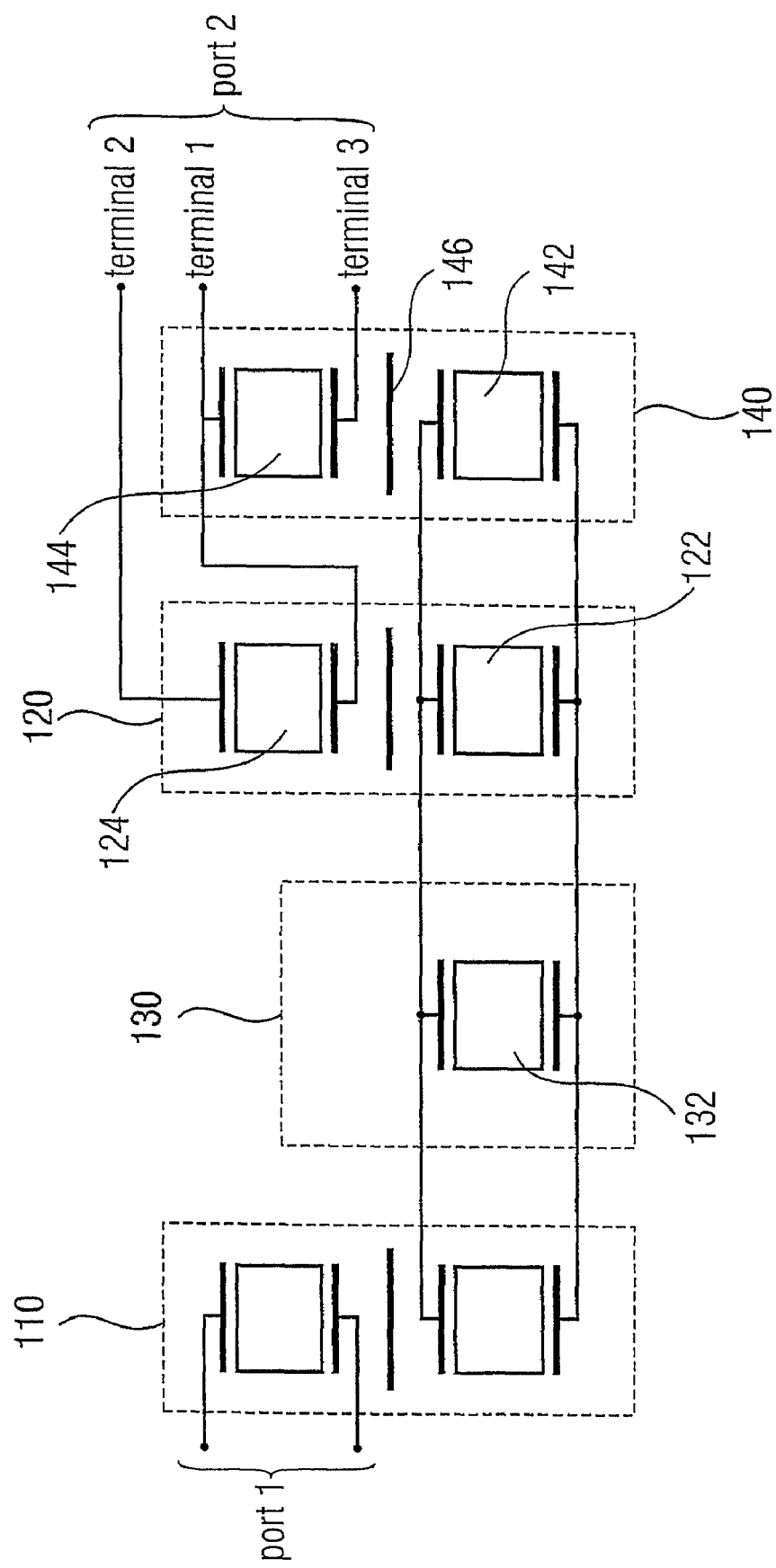
FIG. 2 shows a hybrid coupled resonator filter with a single-to-balanced-mode conversion.

FIG. 2 shows a hybrid CRF, which can provide a single-to-balanced-mode conversion for a signal transmitted from first port to second port. The embodiment as shown in FIG. 2 includes the same elements as for the embodiment shown in FIG. 1, namely the first CRF stage 110 and the second CRF stage 120, which are connected by the filter section 130 including a BAW resonator 132 that is connected in parallel (shunt resonator). In addition, the embodiment as shown in FIG. 2 includes a third CRF stage 140 including a seventh BAW resonator 142 and a sixth BAW resonator 144 that are acoustically coupled by a further coupling layer 146. The seventh BAW resonator 142 of the third CRF stage 140 is electrically connected in parallel to the fourth BAW resonator 122 of the second CRF stage 120. The sixth BAW resonator 144 of the third CRF stage 140 includes a terminal 3 (e.g., for a signal out), which is connected to the electrode between the coupling layer 146 and the piezo layer of the sixth BAW resonator 144. The other electrode of the sixth BAW resonator 144 comprise a connection to terminal 1 (e.g., for a ground out) and hence is connected (in series) to the third BAW resonator 124. If the piezo layers of the third and sixth BAW resonators 124 and 144 includes a same piezoelectric orientation (e.g., both resonators can share a common piezo layer), the signal at terminal 1 when compared to the signal at terminal 3 (for ground at terminal 1) is phase shifted by 180° and hence provides a balanced signal.

In further embodiments, the first CRF stage 110 can be accompanied by a further CRF stage, which connected to the first CRF stage 110 in the same way as the third CRF stage 140 is connected to the second CRF stage 120. In this embodiment, also the signal at first port can include a balanced signal and therefore, besides the mode conversion ability, a full balanced operation is possible.

As in the embodiment shown in FIG. 1, the BAW resonators 112, 132, 122 and 142 shown in the embodiment shown in FIG. 2 can share the same piezoelectric layer and are also denoted by the lower resonators, because they can be formed on a substrate (not shown in FIG. 1 and FIG. 2). The first, third and sixth resonators 114, 124 and 144 are also denoted as upper resonators because they are formed on the coupling layers 116, 126 and 146.

In the embodiment of FIG. 2, the filter section 130 again includes a single BAW resonator 132. In further embodiments, the filter section 130 includes more BAW resonators—shunt as well as series resonators—which can be connected to a ladder type or lattice type filter section.

Figure 3A:
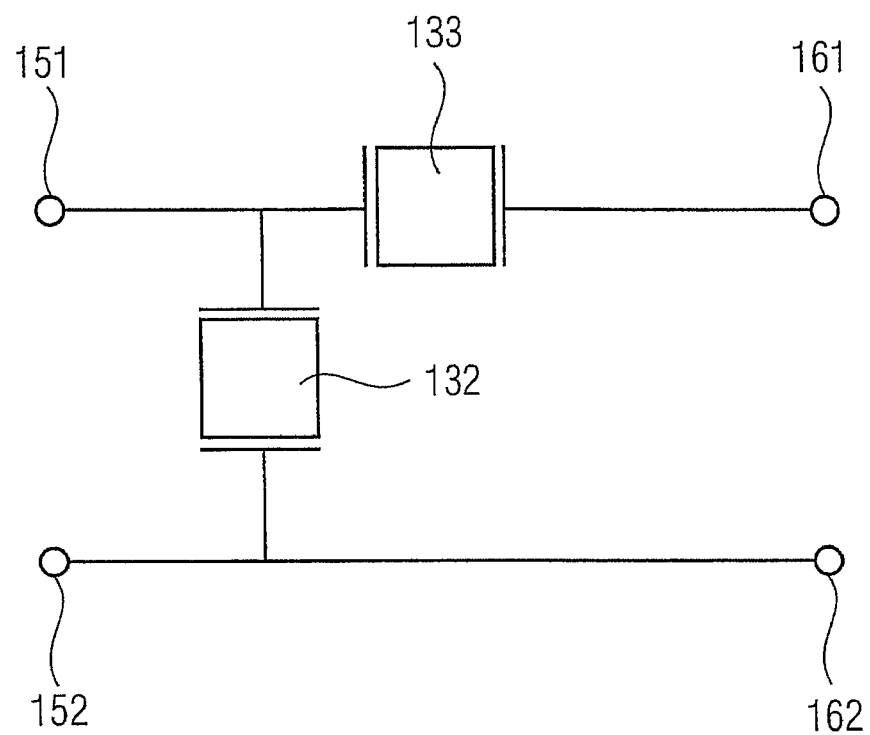
FIGS. 3A and 3B show ladder and lattice type filter sections.
Figure 3B:
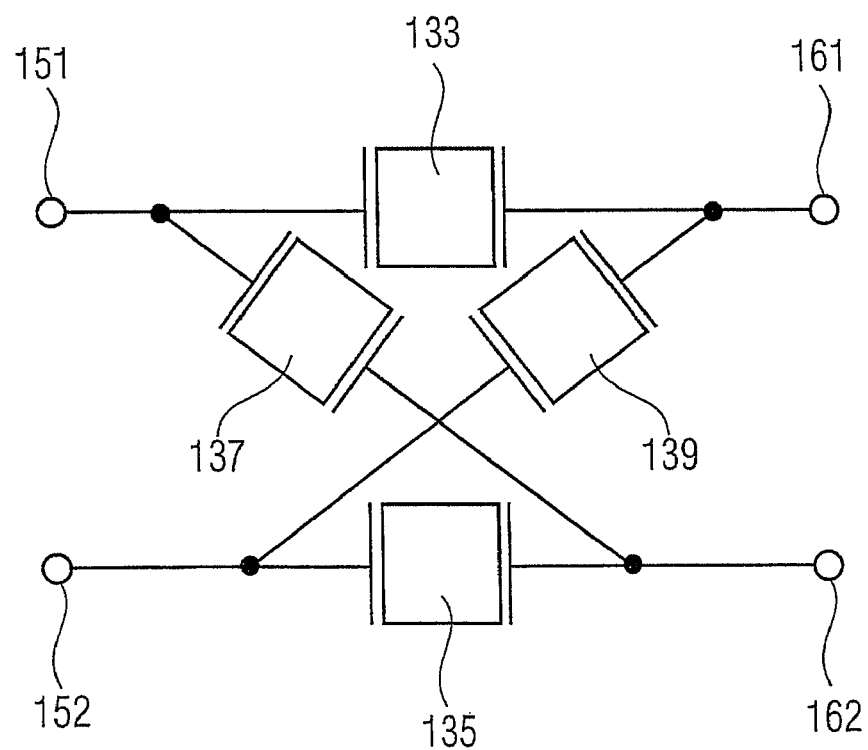

FIGS. 3A and 3B show simple examples for the filter section 130, including the third port with the first and second terminals 151 and 152 and the fourth port with the first and second terminals 161 and 162.

FIG. 3A shows a filter section 130 as a ladder type filter including two BAW resonators, a shunt BAW resonator 132 that is connected in parallel to the first terminal 151 and the second terminal 152 of the third port, and a second BAW resonator 133 that is connected in series between the first terminal 151 of the third port and the first terminal 161 of the fourth port.

FIG. 3B shows the filter section 130, which is designed as a lattice type filter, including four BAW resonators, a first series resonator 133 and a second series resonator 135, wherein the first series resonator 133 connects the first terminal 151 of the third port and the first terminal 161 of the fourth port and the second series BAW resonator 135 connects the second terminal 152 of the third port and the second terminal 162 of the fourth port. In addition, the lattice type filter section 130 as shown in FIG. 3B includes a first cross resonator 137 connecting the first terminal 151 of the third port with the second terminal 162 of the fourth port and a second cross resonator 139 connecting the second terminal 152 of the third port with the first terminal 161 of the fourth port.

The filter sections 130 as shown in FIGS. 3A and 3B are only simple examples and can be combined or extended by adding two or more of these filter sections.

Figure 4:
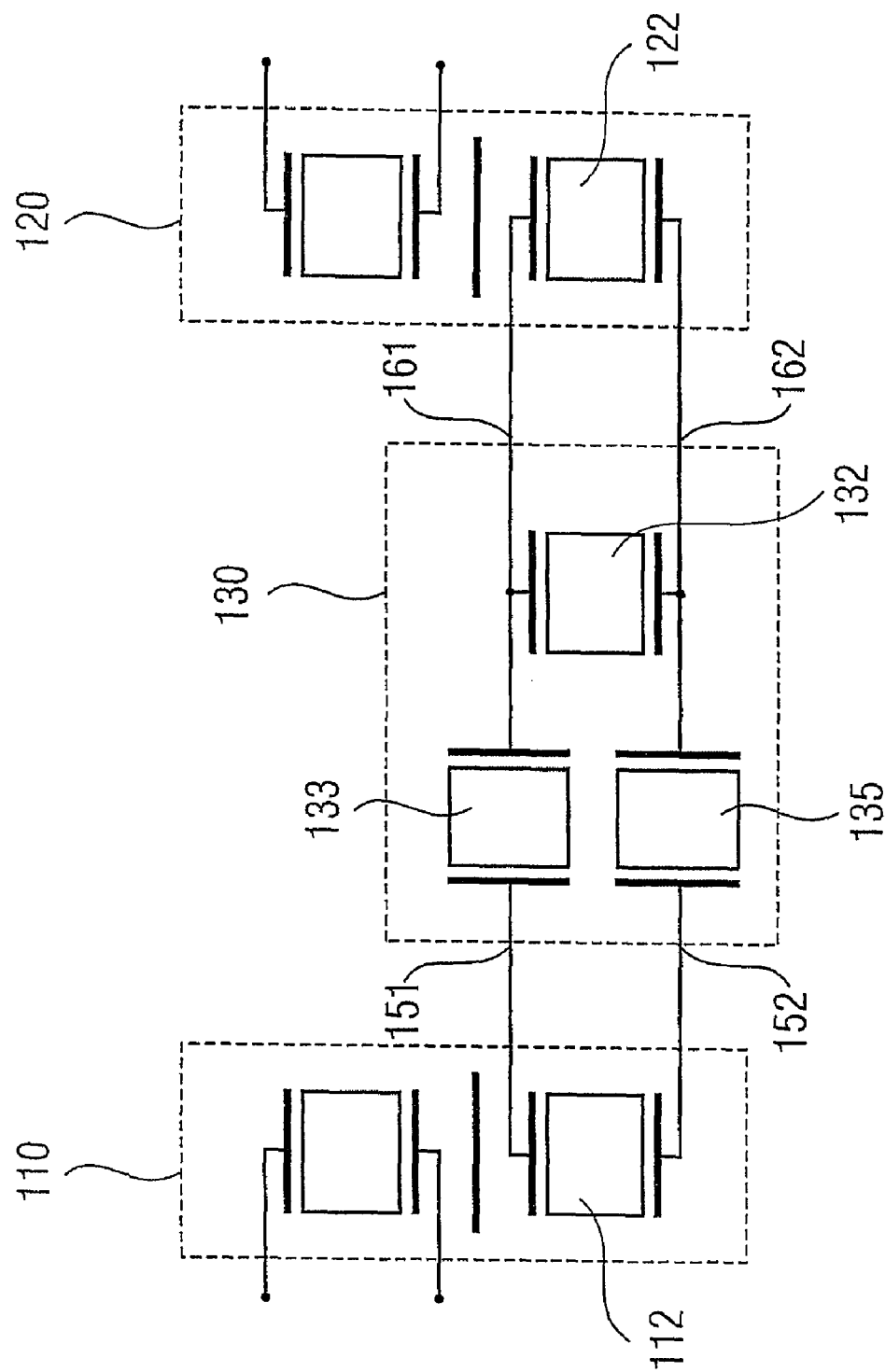
FIG. 4 shows a hybrid coupled resonator filter with a ladder type filter section connecting lower resonators.

FIG. 4 shows an embodiment where the filter section 130 includes a ladder type filter with a first series resonator 133 and a second series resonator 135 and, in addition, a shunt resonator 132. The first series resonator 133 connects the first terminal 151 of the third port with the first terminal 161 of the fourth port, the second series resonator 135 connects the second terminal 152 of the third port with the second terminal 162 of the fourth port, and the shunt resonator 132 connects the first terminal 161 of the fourth port with the second terminal 162 of the fourth port. The third port of the filter section 130 is connected to the second BAW resonator 112 of the first CRF stage 110 and the fourth port of the filter section 130 is connected to the fourth BAW resonator 122 of the second CRF stage 120. Again, the BAW resonators 132, 133, 135 of the filter section 130 and the BAW resonators 112, 122 of the first CRF stage 110 and the second CRF stage 120 can share the same piezoelectric layer, which means that the corresponding electrodes of the BAW resonators 112, 122, 132, 133, 135 are formed at different places along the same piezoelectric layer. The first and second CRF stages 110, 120 include the same elements as in the embodiment of FIG. 1 and a repeated description is omitted here.

Figure 5:
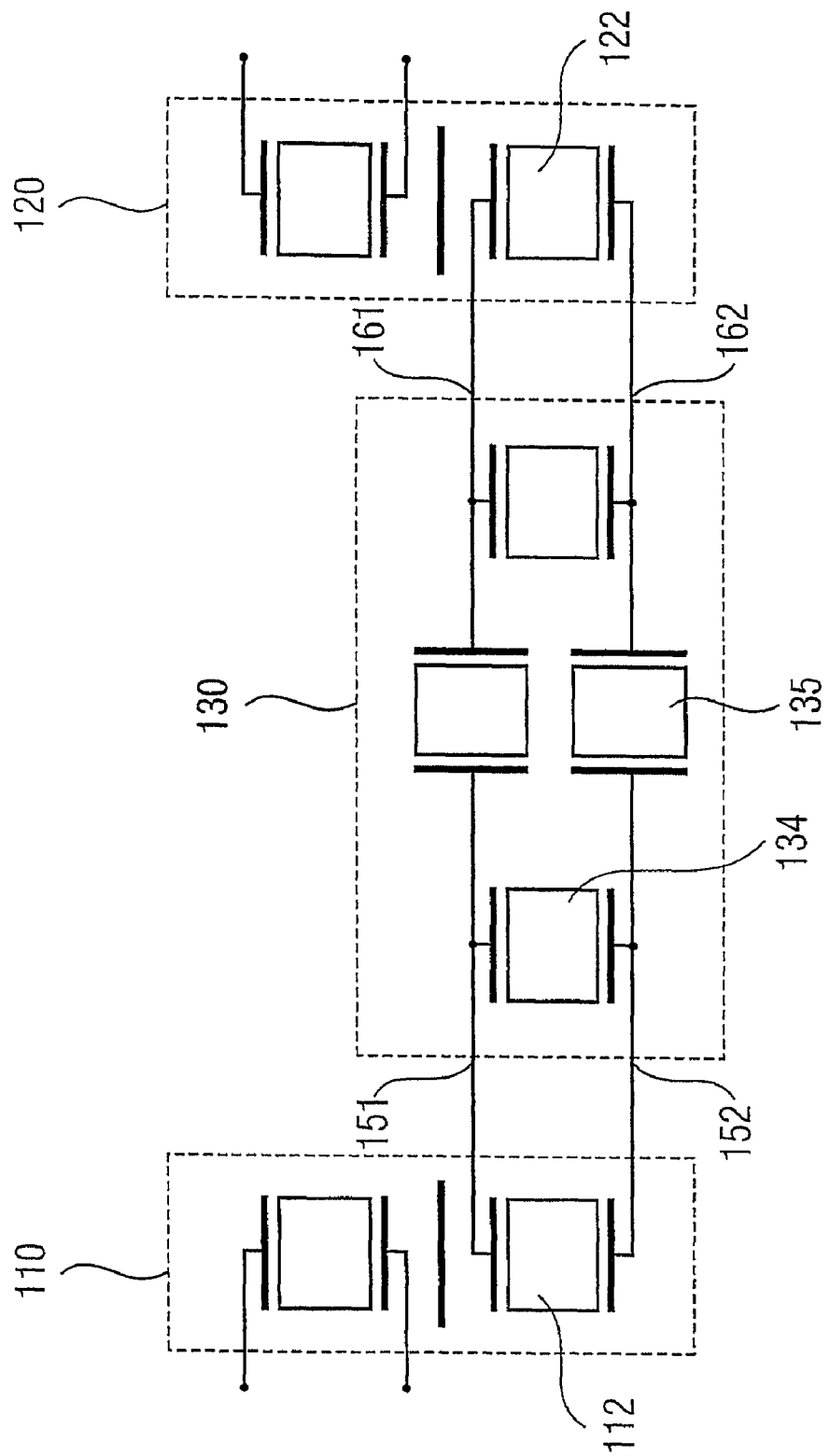
FIG. 5 shows a hybrid coupled resonator filter with a higher order ladder type filter section connecting the lower resonators.

FIG. 5 shows an embodiment of the present invention, which differs from the embodiment as shown in FIG. 4 by adding a second shunt resonator 134 to the filter section 130. The second shunt resonator 134 connects the first terminal 151 of the third port with the second terminal 152 of the third port of the filter section 130. All other elements are already part of the embodiment as shown in FIG. 4, and a repeated description is omitted here. Similarly, the elements of the first and second CRF stages 110, 120 are described already at FIG. 1.

The filter section 130 as used in the embodiments of FIGS. 4 and 5 are so-called higher order ladder type filters including more than two BAW resonators (the embodiment of FIG. 4 there are three resonators and four resonators in FIG. 5 in the filter section 130).

Figure 6:
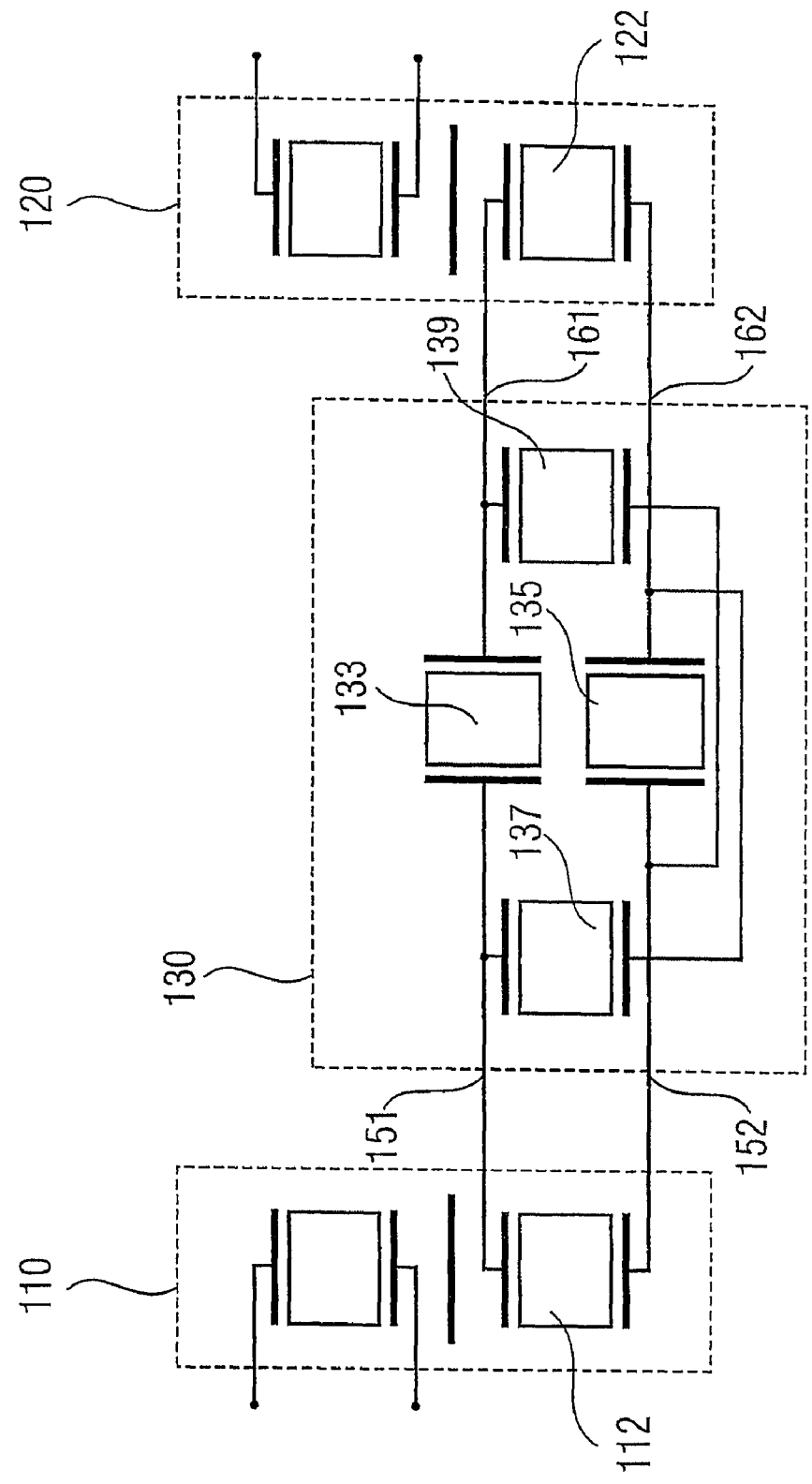
FIG. 6 shows a hybrid coupled resonator filter with a lattice type filter connecting the lower resonators.

FIG. 6 shows a hybrid CRF including a lattice type filter section 130, which again connects the two lower resonators—the second BAW resonator 112 of the first CRF stage 110 with the fourth BAW resonator 122 of the second CRF stage 120. The filter section 130 includes again four BAW resonators, a first series resonator 133 connecting the first terminal 151 of the third port with the first terminal 161 of the fourth port, a second series resonator 135 connecting the second terminal 152 of the third port with the second terminal 162 of the fourth port.

In addition, the lattice type filter section 130 as shown in FIG. 6 includes a first cross resonator 137 connecting the first terminal 151 of the third port with the second terminal 162 of the fourth port and a second cross resonator 139 connecting the second terminal 152 of the third port with the first terminal 161 of the fourth port. All other elements are the same as in the embodiment as shown in FIG. 4 or FIG. 5, and a repeated description is omitted here.

In addition to an improvement of filter skirts, lattice type filter section 130 can increase the bandwidth significantly—the processing, however, needs vias in the lower piezoelectric layer. As before, the embodiment as shown in FIG. 6 can be manufactured monolithically, which means on a common substrate and different BAW resonators can share the same piezoelectric layer. The monolithic integration of the hybrid CRF uses in general, only two piezoelectric layers—one for the lower resonators and another one for the upper resonators. The embodiment as shown in FIGS. 4 to 6 include a single-to-single mode conversion, but as shown in FIG. 2, further embodiments also include a single-to-balanced mode conversion or can operate in fully balanced mode. This can be achieved as shown in FIG. 2 by adding a third CRF stage 140 including again a stacked configuration of a seventh BAW resonator 142 and a sixth BAW resonator 144, which is connected with the second CRF stage 120 in a way as shown in FIG. 2. In these embodiments a single line is connected to the first port of the first CRF stage 110 and a balanced line (with two signal lines) is connected to the second port of the second and third CRF stage 120, 140. In the case of a fully balanced operation, a fourth CRF stage can be added and connected to the first CRF stage 110 in the same manner as the third CRF stage 140 is connected to the second CRF stage 120.

Figure 7:
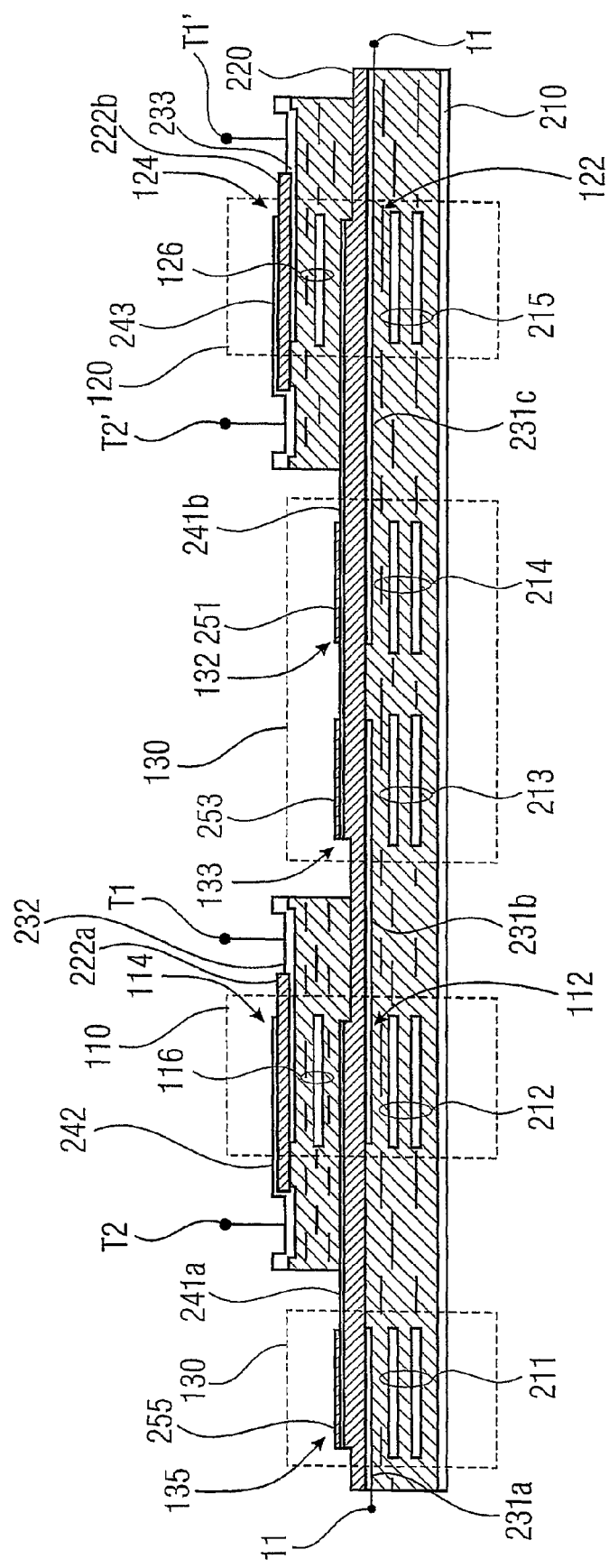
FIG. 7 shows a monolithically integrated structure according to embodiments of the present invention.

FIG. 7 shows a process structure for the monolithic integration of the hybrid CRF, which corresponds to the embodiment as shown in FIG. 4. It shows a substrate 210 including a first acoustical mirror 211, a second acoustical mirror 212, a third acoustical mirror 213, a fourth acoustical mirror 214 and a fifth acoustical mirror 215. Each of these acoustical mirrors can be formed by layer assemblies of alternating high and low acoustic materials and on the acoustical mirrors 211, 212, 213, 214, 215 the resonators, the series resonators 133, 135, the shunt resonator 132 and the BAW resonators 112, 122, are formed. This includes forming a lower electrode 231 and a patterning so that the lower electrode includes a first part 231*a* and a second part 231*b*—a third part 231*c* appearing in FIG. 7 is connected to the first part 231*a* as indicated by a connection 11. On the parts of the lower electrode 231*a* piezo layer 220 is formed and at least partially on the piezo layer 220 an upper electrode 241 is formed and patterned so that the upper electrode 241 includes a first part 241*a* and a second part 241*b*.

The part of the piezo layer 220 that is sandwiched by the first part of the upper electrode 241*a* and the first part of the lower electrode 231*a* includes the second series resonator 135. The part of the piezo layer 220 that is sandwiched by the second part of the lower electrode 231*b* and the first part of the upper electrode 241*a* includes the second BAW resonator 112 of the first CRF stage 110. The part of the piezo layer 220 that is sandwiched by the second part of the lower electrode 231*b* and the second part of the upper electrode 241*b* includes the first series resonator 133. The part of the piezo layer 220 that is sandwiched by the third part of the lower electrode 231*c* and the second part of the upper electrode 241*b* includes the shunt resonator 132 of the filter section 130. The part of the piezo layer 220 that is sandwiched by the third part of the lower electrode 231*c* and the second part of the upper electrode 241*b* includes the fourth BAW resonator 122 of the second CRF stage 120.

On the second BAW resonator 112 of the first CRF stage 110 the coupling layer 116 is formed, wherein the coupling layer 116 can include for example a layer assembly of alternating high and low acoustic impedance materials. On the fourth BAW resonator 122 of the second CRF stage 120, the coupling layer 126 is formed, the coupling layer 126 includes for example a layer assembly including alternating high and low acoustic impedance materials. On the coupling layers 116 and 126, a further piezolayer 222 is formed, wherein on the coupling layer 116, a first part of the further piezolayer 222*a* is formed, and on the coupling layer 126 a second part of the further piezolayer 222*b* is formed. This is done in a way that the first part of the further piezolayer 222*a* is sandwiched between a further lower electrode 232 and a further upper electrode 242, and includes the first BAW resonator 114. In addition, the second part of the further piezolayer 222*b* is sandwiched between a lower electrode 233 and an upper electrode 243 and includes the third BAW resonator 124.

The first BAW resonator 114 of the first CRF stage 110 is connected to terminal T1 and terminal T2 of a first port, wherein terminal T1 is connected to the lower electrode 232 and terminal T2 is connected to the upper electrode 242. The third BAW resonator 124 of the second CRF stage 120 is connected to a terminal T1' and terminal T2' of a second port, wherein terminal T1' is connected to the lower electrode 233 and terminal T2' is connected to the upper electrode 243.

By electrically connecting the first part and the third part of the lower electrode 231*a* and 231*c*, the circuit as shown in FIG. 4 is realized. The electrical connection 11 provides such a circuit.

In manufacturing the device as shown in FIG. 7, the first and second parts of the further electrodes 222*a* and 222*b* can be obtained from a single piezo layer by a structuring (for example by an etching step).

The embodiment as shown in FIG. 7 shows that the BAW resonators 112, 122 of the first and second CRF stages 110 and 120, the first and second series resonators 133 and 135 and the shunt resonator 132 share the same piezoelectric layer 220 and are formed only on different location sites along the surface of the substrate 210. The piezoelectric layer 220 can, for example, include a same thickness for all resonators, which are formed along the piezoelectric layer 220. In order to detune the resonance frequencies of the different resonators as for example the series resonators and the shunt resonator 133, 135 and 132, it is necessary to change the thickness of the corresponding upper electrodes 241 at the position of the resonators. This can be done, for example, by a mass load 251 for the shunt resonator 132 and by a mass load 253 for the first series resonator 133 and a third mass load 255 for the second series resonator 135. These mass loads 251, 253 and 255 can include, for example, additional layers that can be adjusted appropriately so that the filter shows a desired filter characteristic. It is also possible to remove certain parts of the electrodes so that the resonance frequencies of the different BAW resonators can also be shifted in the opposite direction.

What is claimed is:

1. A bulk acoustic wave (BAW) filter device, comprising:
   a first port;
   a second port;
   a first coupled resonator filter stage comprising a first BAW resonator connected to the first port and a second BAW resonator acoustically coupled to the first BAW resonator;
   a second coupled resonator filter stage comprising a third BAW resonator connected to the second port and a fourth BAW resonator acoustically coupled to the third BAW resonator; and
   a filter section comprising: a fifth BAW resonator, the fifth BAW resonator connected between the second BAW resonator and the fourth BAW resonator a third port and a fourth port, each comprising a first and second terminal; and a shunt BAW resonator or series BAW resonator, wherein the shunt BAW resonator is connected in parallel to the third port or the fourth port and the series BAW resonator connects the first terminals of the third and fourth ports or the series BAW resonator connects the second terminals of the third and fourth ports.

2. The BAW filter device according to claim 1, further comprising a substrate, wherein the second BAW resonator is formed between the first BAW resonator and the substrate and wherein the fourth BAW resonator is formed between the third BAW resonator and the substrate.

3. The BAW filter device according to claim 1, wherein the filter section comprises:
   a third port and a fourth port, each port comprising a first and second terminal;
   a shunt resonator; and
   a series resonator,
   wherein the shunt resonator is connected in parallel to the third or fourth port, and wherein the series resonator connects the first terminals of the third and fourth ports or the series resonator connects the second terminals of the third and fourth ports.

4. The BAW filter device according to claim 1, wherein the filter section comprises a lattice filter, the lattice filter comprising:
   a third port and a fourth port, each port comprising a first and second terminal; and
   a first and second cross resonator,
   wherein the first cross resonator connects the first terminal of the third port with the second terminal of the fourth port and the second cross resonator connects the second terminal of the third port with the first terminal of the fourth port.

5. The BAW filter device according to claim 4, wherein the filter section comprises a first series resonator and a second series resonator, the first series resonator connects the first terminals of the third and fourth ports and the second series resonator connects the second terminals of the third and fourth ports.

6. The BAW filter device according to claim 1, wherein the second, the fourth and the fifth BAW resonators are formed at different sites along a piezoelectric layer, at the different sites the piezoelectric layer being sandwiched between electrodes.

7. The BAW filter device according to claim 6, wherein the filter section comprises a plurality of BAW resonators, the plurality of BAW resonators being formed at different sites along the piezoelectric layer.

8. The BAW filter device according to claim 6, wherein the first BAW resonator and the third BAW resonator are formed at different sites along a further piezoelectric layer, at the different sites the further piezoelectric layer being sandwiched between electrodes.

9. The BAW filter device according to claim 6, further comprising:
a substrate, on which the piezoelectric layer is formed;
a first acoustical mirror formed at the substrate at the site of the second BAW resonator;
a second acoustical mirror formed at the substrate at the site of the fourth BAW resonator; and
a third acoustical mirror formed at the substrate at the site of the fifth BAW resonator,
wherein the electrodes comprise a lower electrode, formed between the piezoelectric layer and the substrate.

10. A coupled resonator filter, comprising:
a substrate;
a first port;
a second port;
a first coupled resonator filter stage comprising a first bulk acoustic wave (BAW) resonator and a second BAW resonator, the first BAW resonator being connected to the first port and acoustically coupled to the second BAW resonator;
a second coupled resonator filter stage comprising a third BAW resonator and a fourth BAW resonator, the third BAW resonator being connected to the second port and acoustically coupled to the fourth BAW resonator;
a filter section comprising a fifth BAW resonator electrically connecting the second BAW resonator and the fourth BAW resonator, wherein the filter section comprises:
a third and a fourth port, each port comprising a first terminal and a second terminal; and
a shunt resonator or a series resonator,
wherein the shunt resonator is connected in parallel to the third or fourth port, the series resonator connecting the first terminals of the third and fourth ports or the series resonator connecting the second terminals of the third and fourth ports.

11. The coupled resonator filter according to claim 10, wherein the second BAW resonator is formed between the substrate and the first BAW resonator and wherein the fourth BAW resonator is formed between the substrate and the third BAW resonator.

12. The coupled resonator filter according to claim 10, wherein the second and the fourth BAW resonators and the shunt or series resonator of the filter section are formed at different sites of a piezoelectric layer, each resonator comprising a first electrode and a second electrode formed on opposite sides of the piezoelectric layer.

13. The coupled resonator filter according to claim 10, wherein the second BAW resonator is formed between the substrate and the first BAW resonator and wherein the fourth BAW resonator is formed between the substrate and the third BAW resonator.

14. The coupled resonator filter according to claim 10, further comprising:
a third coupled resonator filter stage comprising a sixth BAW resonator and a seventh BAW resonator, which are acoustically coupled,
wherein the seventh BAW resonator is formed between the sixth BAW resonator and the substrate and is electrically connected in parallel to the fourth port of the filter section,
and wherein the second port further comprises a first, second and third terminal, the sixth BAW resonator is electrically connected in series between the first terminal and the third terminal of second port, the third BAW resonator being connected in parallel to the first terminal and second terminal of the second port.

15. The coupled resonator filter according to claim 10, wherein each BAW resonator comprises a first electrode and a piezoelectric layer formed at least partially on the first electrode and a second electrode formed at least partially on the piezoelectric layer.

16. The coupled resonator filter according to claim 15, wherein the first terminal of the second port comprises a ground output, the second and third terminals of the second port comprising a signal output so that an output signal at the second terminal is phase shifted by 180° to an output signal at the third terminal of the second port and the output signal at the second port comprises a balanced output signal.

17. The coupled resonator filter according to claim 16, wherein the coupled resonator filter in operation performs a single-to-balanced mode conversion for signals from the first port to the second port.

18. The coupled resonator filter according to claim 10, wherein the filter section comprises a third port and a fourth port, each port comprising a first terminal and a second terminal;
a shunt BAW resonator connected in parallel to the fourth port;
a first series BAW resonator connected in series between the first terminals of the third and fourth ports; and
a second series BAW resonator connected in series between the second terminals of the third and fourth ports.

19. The coupled resonator filter according to claim 10, wherein the filter section comprises:
a third port and a fourth port, each port comprising a first terminal and a second terminal;
a first shunt BAW resonator connected in parallel to the third port;
a second shunt BAW resonator connected in parallel to the fourth port;
a first series BAW resonator connected in series between the first terminals of the third and fourth ports; and
a second series BAW resonator connected in series between the second terminals of the third and fourth ports,
wherein the first and second terminals of the third port are electrically connected to the second BAW resonator and the first and second terminals of the fourth port are electrically connected to the fourth BAW resonator.

20. The coupled resonator filter according to claim 10, wherein the filter section comprises:
a third port and a fourth port, each port comprising a first terminal and a second terminal;

a first series BAW resonator connected in series between the first terminals of the third and fourth ports;

a second series BAW resonator connecting in series the second terminals of the third and fourth ports;

a first cross BAW resonator connecting the first terminal of the third port with the second terminal of the fourth port; and a second cross BAW resonator connecting the second terminal of the third port with the first terminal of the fourth port, wherein the first and second terminals of the third port are connected to the second BAW resonator and wherein the first and second terminals of the fourth port are electrically connected with the fourth BAW resonator.

21. The coupled resonator filter according to claim 10, wherein in the substrate acoustical mirrors are formed at sites, where the second, fourth and fifth BAW resonators, the acoustical mirrors comprising a layer assembly of alternating materials of high and low acoustic impedances, and wherein the first and second BAW resonators of the first coupled resonator filter stage are acoustically coupled by a layer assembly of coupling layers of alternating materials of high and low acoustic impedances and the third and fourth BAW resonators are acoustically coupled by a further layer assembly of further coupling layers of alternating materials of high and low acoustic impedances.

* * * * *